United States Patent
Farwell

[11] Patent Number: 5,563,507
[45] Date of Patent: Oct. 8, 1996

[54] METHOD OF TESTING THE INTERCONNECTION BETWEEN LOGIC DEVICES

[75] Inventor: William D. Farwell, Thousand Oaks, Calif.

[73] Assignee: Hughes Aircraft Company, Los Angeles, Calif.

[21] Appl. No.: 339,850

[22] Filed: Nov. 15, 1994

[51] Int. Cl.$^6$ .................................................. G01R 31/02
[52] U.S. Cl. ......................................................... 324/158.1
[58] Field of Search .......................... 324/117 H, 158.1; 365/201; 371/22.3, 22.1, 22.6, 15.1

[56] References Cited

U.S. PATENT DOCUMENTS

| | | | |
|---|---|---|---|
| 5,025,344 | 6/1991 | Maly et al. | 371/21.4 |
| 5,043,655 | 8/1991 | Anholm, Jr. et al. | 324/73.1 |
| 5,343,431 | 8/1994 | Ohtsuka et al. | 365/201 |

*Primary Examiner*—Ernest F. Karlsen
*Assistant Examiner*—Russell M. Kobert
*Attorney, Agent, or Firm*—Leonard A. Alkov; Wanda K. Denson-Low

[57] ABSTRACT

A test circuit for testing interconnections to a non-scannable digital device of a multiple device circuit disposed on an interconnecting substrate. The test circuit includes a current detecting circuit switchably connected between first and second power supply bias nodes of the digital device, and circuitry for applying a pattern of logical test signals to selected ones of the input and output nodes of the digital device, whereby the current detecting circuitry detects the conduction of current in the reverse bias paths of input and output buffers of the device. The circuitry for applying test signals can comprise a scannable digital device included with the non-scannable device on the interconnecting substrate, as well as automatic test equipment connected to inputs and outputs of the interconnecting substrate.

4 Claims, 2 Drawing Sheets

5,563,507

METHOD OF TESTING THE INTERCONNECTION BETWEEN LOGIC DEVICES

BACKGROUND OF THE INVENTION

The subject invention is directed generally to testing interconnections between digital devices of a system, and more particularly to an interconnect testing technique that utilizes current injection.

Digital systems or modules are typically comprised of digital devices such as integrated circuits, application specific integrated circuits, hybrids, and circuit boards, for example, which are interconnected. The interconnections between digital devices of a digital system need to be tested, and such testing significantly increases in complexity as the number of interconnections increases. Boundary scan capability is commonly incorporated into digital devices to facilitate interconnect testing, but not all digital devices include boundary scan capability. Interconnections to digital devices without boundary scan capability can be tested pursuant to functional testing of the interconnected digital devices, but such testing is difficult to implement in such a manner as to fully detect all interconnect faults and moreover is incapable of distinguishing between interconnect faults and device faults.

SUMMARY OF THE INVENTION

It would therefore be an advantage to provide a technique for testing interconnections to digital devices that do not include boundary scan capability.

The foregoing and other advantages are provided by the invention in a test circuit that includes a current detecting circuit switchably connected between first and second power supply bias nodes of a digital device without boundary scan capability, and circuitry for applying a pattern of logical test signals to selected ones of the input and output nodes of the digital device, whereby the current detecting circuitry detects the conduction of current in the reverse bias paths of input and output buffers of the device.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
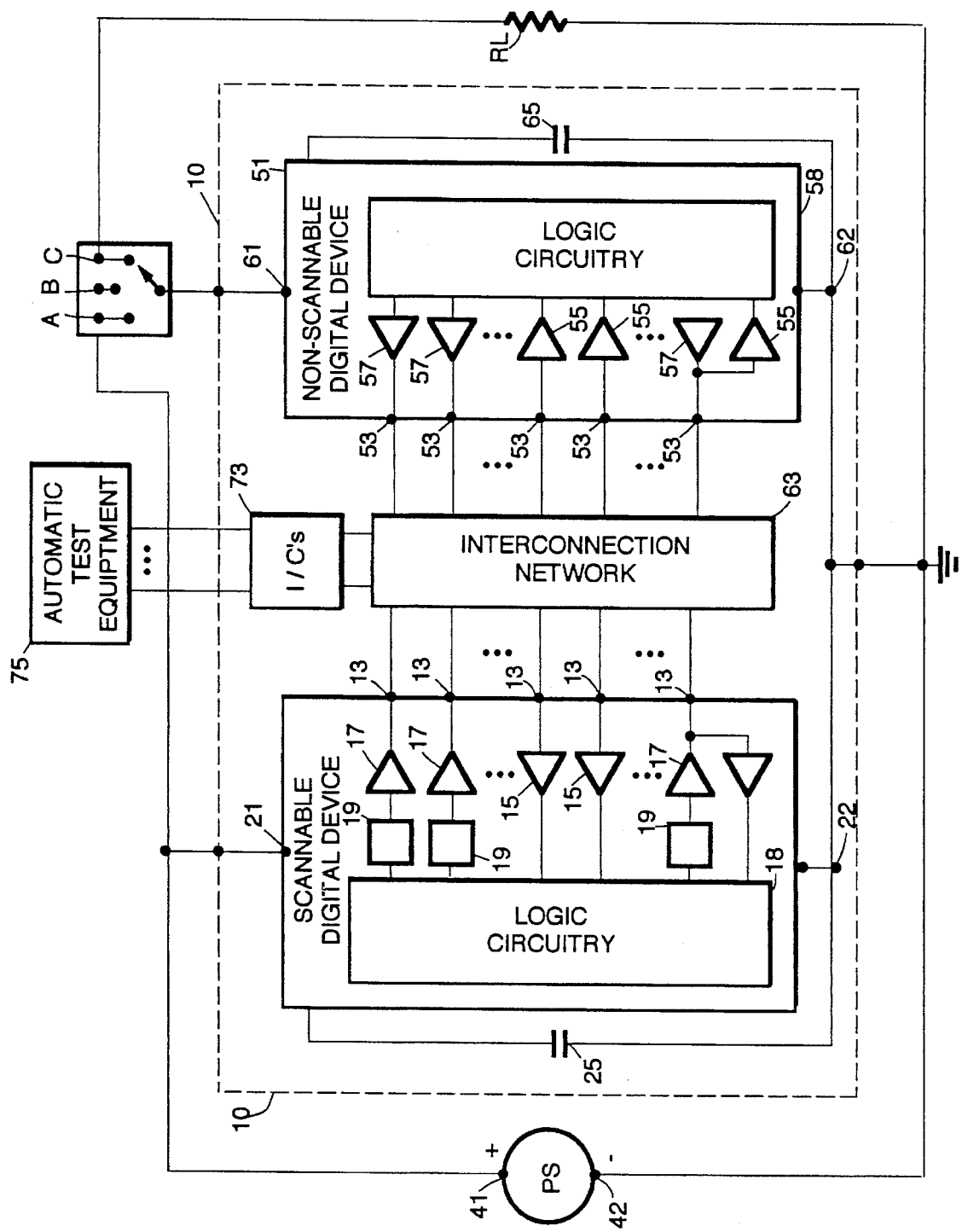
FIG. 1 is schematic circuit diagram of a multiple device circuit and external test circuitry for testing a digital device in the multiple device circuit in accordance with the invention, wherein the digital device does not have boundary scan capability.

In the following detailed description and in the several figures of the drawing, like elements are identified with like reference numerals.

Referring now to FIG. 1, set forth therein is a schematic illustration of a multiple device circuit and external circuitry that implement the invention. The multiple device circuit is comprised of a plurality of digital devices supported by an interconnecting substrate 10, and is shown in FIG. 1 for purposes of illustration as including a digital device 11 having boundary scan capability, and a digital device 51 that does not include boundary scan capability. By way of illustrative examples, the interconnecting substrate 10 comprises a printed wiring board, a multi-chip hybrid, or a back plane.

The boundary scannable device 11 includes input buffers 15 for receiving digital input signals and output buffers 17 providing digital output signals, all on input and/or output (I/O) nodes 13. Any particular I/O node can be configured to provide solely to receive an input or to provide an output, or it can be configured to receive an input and as well as provide an output. The boundary scannable device 11 further includes boundary scan circuits 19 whose outputs are provided to output buffers 17. In accordance with conventional boundary scan architecture, each of the boundary scan circuits 19 includes a scan register and appropriate multiplexing circuitry, and the outputs of the boundary scan circuits 19 comprise serially inputted boundary scan values or outputs of logic circuitry 18 of the digital device, while the outputs of the input buffers 15 are provided to the logic circuitry 18 of the scannable digital device 11.

For power, the digital device 11 includes first and second bias nodes 21, 22 respectively connected to the supply and reference nodes 41, 42 of a power supply PS via appropriate connectors on the interconnecting substrate 10. By way of illustrative example, the supply node 41 is at a potential that is positive relative to the reference node which is shown as being ground. A conventional local energy storage capacitor 25 is connected between the first and second bias nodes 21, 22. Although not shown, it should be appreciated that all active devices in the boundary scannable digital device 11 are powered by the voltage across the first and second bias nodes 21, 22 as provided by the power supply PS.

It should be appreciated that in accordance with the conventional operation of digital devices, logic signals at the I/O nodes 13 of the scannable digital device 11 and I/O nodes of other digital devices on the interconnecting substrate 10, including the digital device 51 described further herein, comprise voltages that are referenced to the potential of the power supply reference node 42, whether sourced by active devices in the digital devices on the interconnecting substrate or external connections to substrate I/Os 73, which are also described further herein. In particular, a first logical state is represented by a voltage that is zero with respect to the potential of the reference node, and a second logical state is represented by a predetermined voltage that is not zero with respect to the potential of the reference node of the power supply. The supply node of the power supply is configured to have a voltage that is substantially equal to such predetermined non-zero voltage which for purposes of illustrative example is positive with respect to the potential of the power supply reference node.

The non-scannable device 51 includes input buffers 55 for receiving digital input signals and output buffers 57 for providing digital output signals, all on input and/or output (I/O) nodes 53. Any particular I/O node 53 of the non-scannable device 51 can be configured solely to receive an input or to provide an output, or it can be configured to receive an input and as well provide an output. In accordance with conventional architecture, inputs to the output buffers comprise outputs of logic circuitry 58 of the non-scannable digital device 51, while the outputs of the input buffers 55 are provided to the logic circuitry 58 of the non-scannable digital device 51.

For power, the circuitry of the digital device 51 includes first and second bias nodes 61, 62 which are respectively connected to the supply and reference nodes of the power supply PS via appropriate connectors on the interconnecting substrate 10. A conventional local energy storage capacitor 65 is connected between the first and second bias nodes 61, 62. Although not shown, it should be appreciated that all active devices in the non-scannable digital device 51 are powered by the voltage across the first and second bias nodes 61, 62. In accordance with conventional logic circuit design, the input buffers 55 and the output buffers 57 of the non-scannable device 51 include reverse bias paths through which current will flow upon application of positive voltage signals at any I/O node 53 of the non-scannable device 51 while zero bias voltage is applied across the first and second bias nodes 61, 62 of the non-scannable digital device 51. This will induce a parasitic current between the first bias node 61 and the I/O node 53 of the non-scannable digital device 51.

The interconnecting substrate 10 further includes substrate inputs/outputs (I/Os) 73 by which the multiple device circuit receives digital inputs and transmits digital outputs. The substrate I/Os 73, the I/O nodes 53 of the non-scannable digital device 51, and the I/O nodes 13 of the scannable device are interconnected by an interconnection network 63 supported by the interconnecting substrate 10, whereby each of the I/O nodes 53 of the non-scannable device is connected to an interconnect node in the interconnection network 63. For purposes of testing, automatic test equipment (ATE) 75 can be connected to the substrate I/Os 73.

Figure 2:
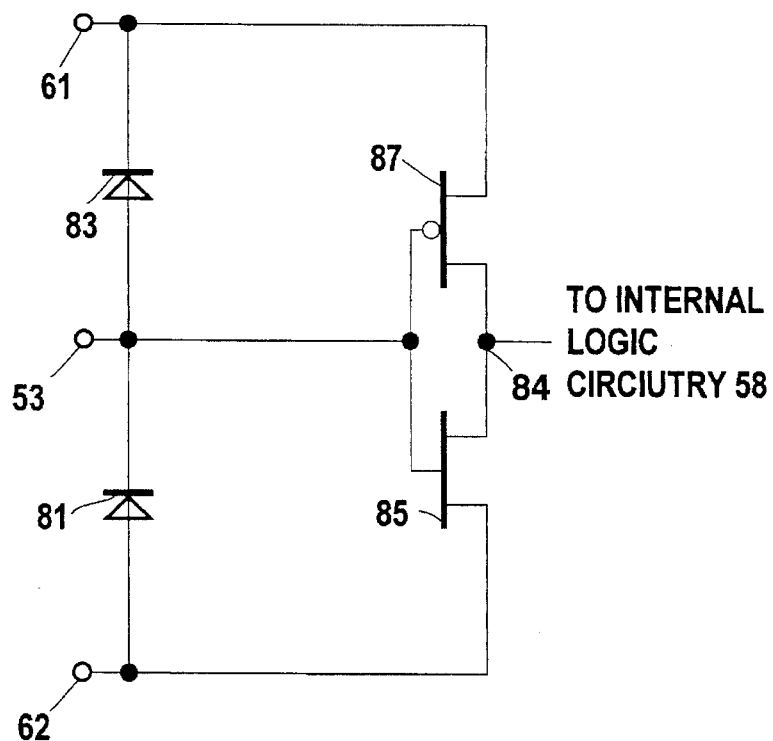
FIG. 2 is a schematic circuit diagram of a typical input buffer that would be conventionally utilized in the digital device without boundary scan capability.

Referring now to FIG. 2, set forth therein is a schematic illustration of a typical CMOS input buffer that can be implemented as each of the input buffers 55 of the non-scannable digital device 51. The input buffer of FIG. 2 includes a first diode 81 having its anode connected to the second bias node 62 of the non-scannable digital device 51 and its cathode connected to the anode of a second diode 83 which has its cathode connected to the first bias node 61 of the non-scannable digital device 51. The node between the diodes 81, 83 is connected to a corresponding I/O 53 of the non-scannable digital device, and is further connected to the gates of an N-channel transistor 85 and a P-channel transistor 87. The diodes 81, 83 comprise an input overvoltage protection circuit that is commonly included in CMOS device inputs. The source of the N-channel transistor 85 is connected to the second bias node 62 of the non-scannable digital device 51 while the drain of the N-channel transistor 85 is connected to the drain of the P-channel transistor 87 at a node 84. The source of the P-channel transistor is connected to the first bias node 61 of the non-scannable digital device 51. The node 84 formed by the connection of the drains of the N-channel transistor 85 and the P-channel transistor 87 provides the output of the input buffer and is connected to the logic circuitry 58 of the non-scannable digital device 51. The reverse bias path is between the I/O pin 53 and the first bias node 61, through the input overvoltage protection diode 83.

Figure 3:
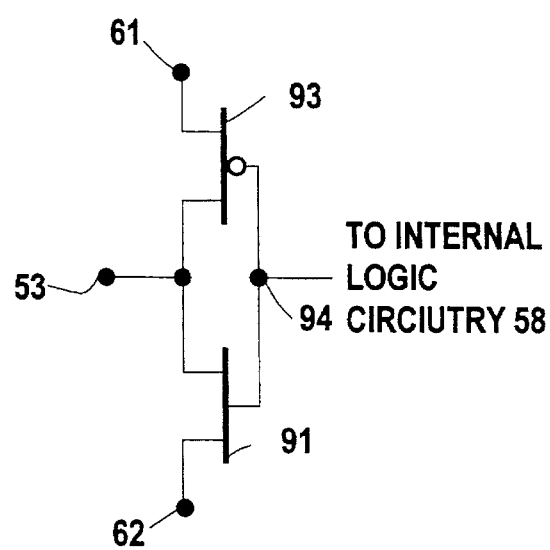
FIG. 3 is a schematic circuit diagram of a typical output buffer that would be conventionally utilized in the digital device without boundary scan capability.

Referring now to FIG. 3, set forth therein is a schematic illustration of a typical CMOS output buffer that can be implemented as each of the output buffers 55 of the non-scannable digital device 51. The output buffer of FIG. 3 includes an N-channel transistor 91 and a P-channel transistor 93 which have their gates connected together to form a node 94 which comprises the input to the output buffer and is further connected the internal logic circuitry 58 of the non-scannable digital device 51. The source of the N-channel transistor 91 is connected to the second bias node 62 of the non-scannable digital device 51, while the drain of the N-channel transistor 91 is connected to the drain of the P-channel transistor 93. The source of the P-channel transistor 93 is connected to the first bias node 61 of the non-scannable digital device 51. The node formed by the connection of the drains of the N-channel transistor 91 and the P-channel transistor 93 provides the output of the output buffer and is a corresponding I/O 53 of non-scannable digital device 51. The reverse bias path is between the I/O node 53 and the first bias node 61 of the non-scannable digital device 51, through the P-channel transistor 93.

In accordance with the invention, the first bias node 61 of the non-scannable digital device 51 is connected to a fixed node of a three-position switch 71, while the second bias node 62 of the non-scannable digital device 51 is connected to the reference node of the power supply PS. A switched node A of the three-position switch is connected to the supply node of the power supply, while a switched node C of the three-position switch is connected to one terminal of a load resistor RL which has its other terminal connected to the reference node of the power supply PS. A switched node B of the three-position switch is open. Thus, the three-position switch controls whether the first node 61 of the non-scannable device 51 is (a) connected to the supply node of the power supply PS (switch in the A position), open (switch in the B position), or (c) connected to the load resistor RL (switch in the C position).

Effectively, the bias node 61 of the non-scannable device 51 can be selectively isolated from the supply node of the power supply PS and connected to the load resistor RL such that the only electrical inputs to the non-scannable device 51 are provided by the voltages between the I/Os of the non-scannable device 51 and the reference node of the power supply PS. Thus, any voltage applied to the non-scannable device via an interconnect node in the interconnection network 63 and the reference node of the power supply PS will result in a voltage across the load resistor, and any voltage across the load resistor can occur only pursuant to voltage applied to one or more of the interconnects to the non-scannable device.

The interconnections to the non-scannable device are tested as follows:

1. The power supply PS is turned off.

2. The three-position switch is placed in the C position such that the load resistor RL is connected between the first and second bias nodes of the non-scannable device 51.

3. The power supply PS is turned on.

4. A series of patterns of test signals are applied to the desired interconnect nodes of the interconnect network that are connected to the non-scannable device, for example via boundary scan on the scannable device 11 and/or by the ATE 75 via the substrate I/Os 73, as appropriate. Each of the series of patterns includes only one test signal having a predetermined logical state represented by a voltage that is positive with respect to the potential of the reference node, while all other test signals each pattern are of a state that is represented by the potential of the reference node, and the position of the signal of the predetermined state is different for each of the patterns such that each of the desired interconnect nodes connected to the non-scannable device is driven once with the predetermined logical state in the course of the series of patterns. For the particular example wherein a logical 0 is represented by the reference potential and a logical 1 is represented by a voltage that is positive with respect to the potential of the reference node, the predetermined state would be a logical 1, and each pattern would include all 0s except for a single 1. The test signals applied via the substrate I/Os 73 would be applied to the I/Os by automatic test equipment.

6. Steps 4 and 5 are repeated for different patterns until each of the interconnect nodes connected to an I/O of the non-scannable device and intended to be tested has been driven once with the predetermined logical state that is represented by a voltage that is different from the reference potential.

7. The results of measuring the voltage across the load resistor RL are analyzed. If the measured voltage across the load resistor is equal to the reference potential, which can be 0 volts, then an open exists in the interconnection to the non-scannable device I/O that is connected to the interconnect node which was driven with the single instance of the predetermined logical state that is represented by a voltage that is different from the reference potential. If the voltage across the load resistor is not equal to the reference potential, then no fault has been detected as to the interconnection to the non-scannable device I/O that is connected to the interconnect node which was driven with the single instance of the predetermined logical state that is represented by a voltage that is different from the reference potential.

The invention contemplates that the multiple device circuit on the interconnecting substrate 10 includes an arbitrary number of scannable devices as well as an arbitrary number of non-scannable digital devices, and each non-scannable digital device would include a three-position switch connected to the power supply PS, the load resistor RL, and a bias node of the non-scannable device substantially as shown in FIG. 1 for the non-scannable device 51. The interconnections to the non-scannable devices are tested on a device by device basis by placing the three position switch of the non-scannable device being tested in the C position, such that the load resistor for the non-scannable device being tested is connected between the bias nodes thereof, while the three position switches of the non-scannable devices not being tested are in the B position such that the bias nodes thereof are open. The series of test patterns are applied by the I/Os of the scannable devices and/or the substrate I/Os which are connected to the desired interconnect nodes that are connected to the non-scannable device being tested.

The foregoing has been a disclosure of a technique for detecting and isolating interconnect failures of non-scannable digital devices which requires no internal probing and is suitable for automatic programming.

Although the foregoing has been a description and illustration of specific embodiments of the invention, various modifications and changes thereto can be made by persons skilled in the art without departing from the scope and spirit of the invention as defined by the following claims.

What is claimed is:

1. A test circuit for testing interconnections to a digital device without boundary scan capability, the digital device having first and second power supply bias nodes, a plurality of input and output buffers having reverse bias current paths wherein each such path is respectively connected between said first and second power supply bias nodes, and respective input and output nodes connected to said input and output buffers, the test circuit comprising:

current detecting means three-position switchably connected between said first and second power supply bias nodes; and means for applying a pattern of logical test signals to selected ones of the input and output nodes of the digital device, wherein said pattern of logical test signals includes only one logical signal that will produce a current in the reverse bias path of the input or output buffer to which said one logical signal is applied;

whereby said current detecting means detects the conduction of current in the reverse bias paths of the input and output buffers.

2. The test circuit of claim 1 wherein said means for applying logical test signals includes a digital device having boundary scan capability.

3. The test circuit of claim 1 wherein said means for applying logical test signals includes automatic test equipment.

4. A method for testing interconnections to a digital device without boundary scan capability, the digital device having first and second power supply bias nodes, a plurality of input and output buffers having reverse current bias paths each path respectively connected between said first and second power supply bias nodes, and input and output nodes connected to said input and output buffers, the method comprising the steps of:

applying a pattern of logical test signals to selected ones of the input and output nodes of the digital device by controlling a digital device having boundary scan capability to apply logical test signals, wherein the pattern of logical test signals includes only one logical signal that will produce a current in the reverse bias path of the input or output buffer to which the one logical signal is applied; and detecting the conduction of current in the reverse bias paths of the input and output buffers pursuant to the application of logical test signals to selected ones of the input and output nodes.

\* \* \* \* \*